United States Patent [19]

Yoshino

[11] 4,191,921
[45] Mar. 4, 1980

[54] CORONA DISCHARGE DETECTION APPARATUS WHICH ELIMINATES PERIODIC NOISE

[75] Inventor: Hironori Yoshino, Takarazuka, Japan

[73] Assignee: Matsushita Electric Industrial Co. Ltd., Osaka, Japan

[21] Appl. No.: 846,397

[22] Filed: Oct. 28, 1977

[30] Foreign Application Priority Data

Oct. 30, 1976 [JP] Japan .................................. 51-130610
Nov. 30, 1976 [JP] Japan .................................. 51-144138

[51] Int. Cl.$^2$ ........................ G01R 31/14; H04B 15/00
[52] U.S. Cl. ........................................ 324/54; 324/72; 328/135; 328/165
[58] Field of Search .............. 324/54, 72, 77 D, 77 R, 324/83 D, 102, 140 R, 140 D, 57 N, 99 D; 364/768, 769, 574; 328/135, 162, 151, 165, 146; 179/1 P; 325/473; 340/347 SH

[56] References Cited

U.S. PATENT DOCUMENTS

| | | | |
|---|---|---|---|
| 3,015,774 | 1/1962 | Eigen | 324/54 |
| 3,403,227 | 9/1968 | Malm | 324/77 D X |
| 3,727,129 | 4/1973 | Hummert | 324/54 |
| 3,737,769 | 6/1973 | Terase et al. | 324/54 |
| 3,739,272 | 6/1973 | McKean | 324/54 |
| 3,758,763 | 9/1973 | Nohara et al. | 324/83 D X |
| 3,763,362 | 10/1973 | Griem | 364/574 |
| 3,816,815 | 6/1974 | Schumann | 324/102 X |
| 3,889,185 | 6/1975 | Wojtasinski et al. | 324/72 |
| 3,917,996 | 11/1975 | Wagner et al. | 324/72 |
| 3,927,309 | 12/1975 | Fujiwara et al. | 328/135 X |
| 4,054,785 | 10/1977 | Lehmann | 324/77 D |

Primary Examiner—Gerard R. Strecker
Attorney, Agent, or Firm—Stevens, Davis, Miller & Mosher

[57] ABSTRACT

A corona discharge detection apparatus particularly suited for use in detecting corona signals mixed with noise which is in synchronism with a cycle of a power supply such as corona discharge which occurs in a flyback transformer of a television receiver. The noise and the corona signals are converted to a digital signal and the digital signals in two cycles are subtracted one from the other and the resulting digital signal is converted to an analog signal for observation. In this manner, a corona signal which has not been detected by a phase technique can now be detected.

11 Claims, 23 Drawing Figures

CORONA DISCHARGE DETECTION APPARATUS WHICH ELIMINATES PERIODIC NOISE

The present invention relates to a corona discharge detection apparatus useful in detecting corona discharge which occurs in a flyback transformer of a television receiver or the like.

In a prior art corona discharge detection apparatus, an electrical signal (corona signal) taken out by a coupling circuit which is electrically coupled to a sample is amplified in a wide band or narrow band and the resulting signal is displayed for observation on an oscilloscope or recorder. In this method, a small corona signal is directly amplified and observed in the form of analog signal. Although this method is usually satisfactory in observing and evaluating the corona signal, the detection of the corona signal is very difficult when a frequency spectrum of noise is substantially the same as that of the corona signal and a voltage level of the noise is high and a small corona signal is superimposed on the noise resulting in a low S/N ratio, where S is a corona signal strength and N is a noise strength.

As examples of the prior art corona discharge detection apparatus, those disclosed in the U.S. Pat. Nos. 3,015,774 to D. Eigen, 3,727,129 to Hummert, 3,739,272 to Mckean and the type ERA-III corona detection apparatus have been known. Basically, they are constructed to separate the corona signal by a coupling circuit and amplify the separated corona signal for observation. Of those patents, the patent to D. Eigen refers to a noise problem, in which the noise to be eliminated is that introduced in a transformer through a power line and in an amplifier and that introduced by radiation. The principle of noise elimination is that since an amplifier which amplifies the corona signal amplifies the noise as well while an amplifier which amplifies only the noise (by separating the noise introduced from the power line or by radiation) produces only the amplified noise, only the corona signal can be extracted by subtracting the outputs of those amplifiers one from the other. In this method, the noise can be eliminated only if the noise is an external noise which occurs simultaneously with the corona signal to be detected and which can be separated from the corona signal. When the noise occurs in the high voltage transformer in FIG. 1 of the patent to D. Eigen, however, the noise cannot be separated from the corona signal, because the noise is not externally introduced but included in the voltage applied to the sample. It is impossible to extract the noise only, and the extracted noise necessarily accompanies the corona signal. In such a circumstance, therefore, the method of noise elimination disclosed in the patent to D. Eigen is of no use.

It is an object of the present invention to provide a corona discharge detection apparatus which eliminates the troublesome noise that makes detection of the corona discharge difficult and which is not externally introduced but introduced from the sample (for example, a high voltage from the sample such as a transformer) or included in a voltage applied to the sample in the form undistinguishable from the corona signal. The noise the present invention intends to eliminate is that which appears periodically in the same pattern in synchronism with a cycle of a power supply such as harmonic noise from a flyback pulse which poses a problem in detecting the corona discharge of a high voltage flyback transformer used in a television receiver.

Those and other objects, features and advantages of the present invention will be apparent from the following description of the preferred embodiments of the invention when taken in conjunction with the accompanying drawings, in which.

Figure 1:
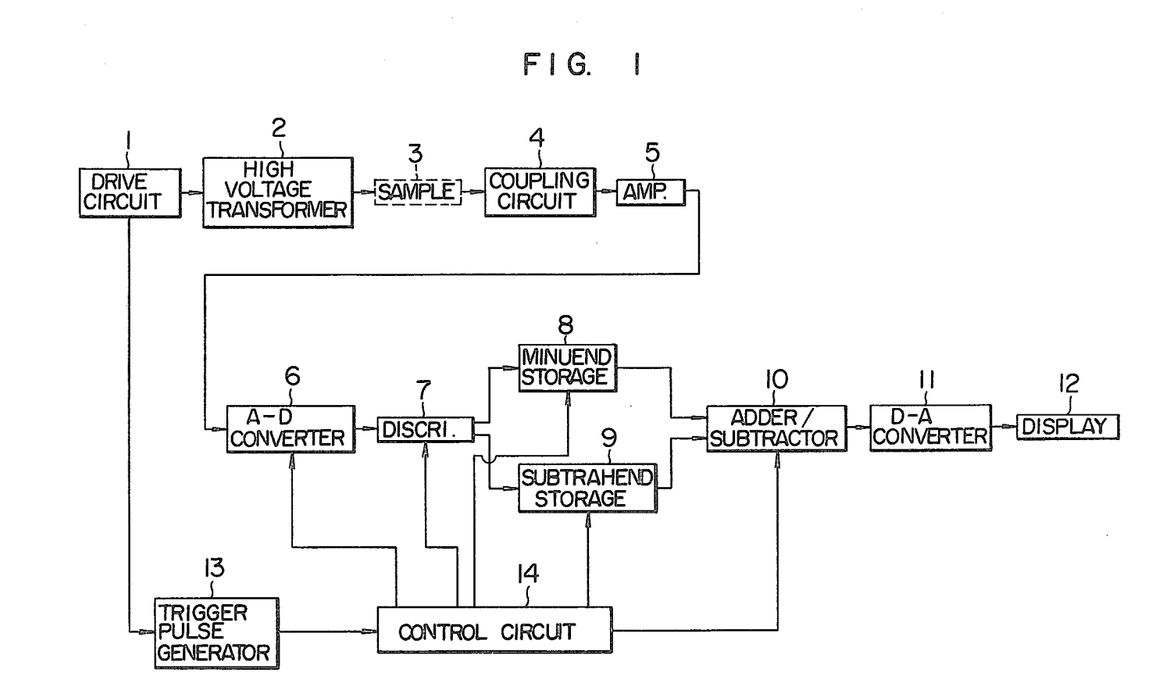
FIG. 1 is a block diagram of one embodiment of the present invention.

Referring now to FIG. 1, a high voltage transformer 2 connected to a drive circuit 1 generates a high voltage. An object to be tested may be the high voltage transformer 2 itself (for evaluating the insulation of the high voltage transformer) or a sample 3 where a corona-free high voltage transformer is used to apply a high voltage to the sample 3. A corona signal together with periodic noise is extracted by a coupling circuit 4 and amplified by an amplifier 5. FIG. 5(b) shows a waveform of the output of the amplifier 5 as observed by an oscilloscope. In the present embodiment, the output of the amplifier 5 is applied to an input of an analog-digital converter 6. If the corona signal is sampled at a sampling frequency which is an integer multiple of the frequency of the power supply voltage and a sum of errors of which per cycle of power supply voltage is within 4% of a cycle at a maximum frequency of main noise, the corona signal may be sampled continuously over several cycles of the power supply voltage without significant problem. The sampling frequency is selected such that it is an integer multiple of the frequency of the power supply voltage because it is necessary to sample repetitively at the same phase as that of the power supply voltage, as will be described in detail hereinafter. It is desirable that the sum of the errors of the sampling frequency per cycle of the power supply voltage is within 4% of the cycle at the highest frequency of the main noise because if an error at a sampling point corresponding to a phase at the sampling point in the previous cycle of the power supply voltage cycle is within .4% of the cycle at the highest frequency of the main noise, the major noise level can be suppressed to less than one quarter when the digital values at the same phase sampling points in two cycles are subtracted one from the other. The term main noise used herein indicates noise which makes the observation of the corona signal unidentifiable. On the other hand, a control circuit 14 produces timing pulses and control pulses for signaling the start stop, start of operation and end of operation of the A–D conversion, based on pulses from a trigger pulse generating circuit 13 which produces pulses in synchronism with the drive circuit 1. The A–D converter 6 starts the A–D conversion in response to the start pulse from the control circuit 14. The output of the A–D converter 6 is stored by a discriminator 7 in a minuend signal storage circuit 8 as a minuend signal for a given time interval in the period of the power supply voltage cycle and then stored in a subtrahend signal storage circuit 9 as a subtrahend signal for the same time interval beginning at the same phase of the power supply voltage as the phase at which the A–D conversion has started. The above steps are repeated so that a plurality of sets of the minuend and the subtrahend are established. It should be understood that the subtrahend signal may be stored first. After the both signals have been stored, the subtrahend signal is subtracted from the minuend signal by an adder/subtracter 10 in phase with the power supply voltage, and a differential signal is applied to a D–A (digital-analog) converter 11 the output of which is displayed in a display 12 such as oscilloscope or recorder. As described above, the corona discharge detection apparatus of the present embodiment comprises the main power supply section including the drive circuit 1 which drives the high voltage transformer 2; signal detection section including the coupling circuit 4 for extracting the corona signal and the amplifier 5 connected to the coupling circuit 4; the signal processing section including the A–D converter 6 connected to the amplifier 5, the storage circuits 8 and 9 for storing the outputs of the A–D converter 6, the adder/subtractor 10 for subtracting the digital signals stored in the storage circuits 8 and 9 and the D–A converter 11 which receives the output of the adder/subtractor 10; and the control section including the display 12 such as oscilloscope or recorder connected to the D–A converter 11, the trigger pulse generating circuit 13 connected to the drive circuit 1 for generating the pulses in synchronism with the signal of the drive circuit 1 and the control circuit for producing the timing pulses and the control pulses based on the trigger pulses.

Figure 2:
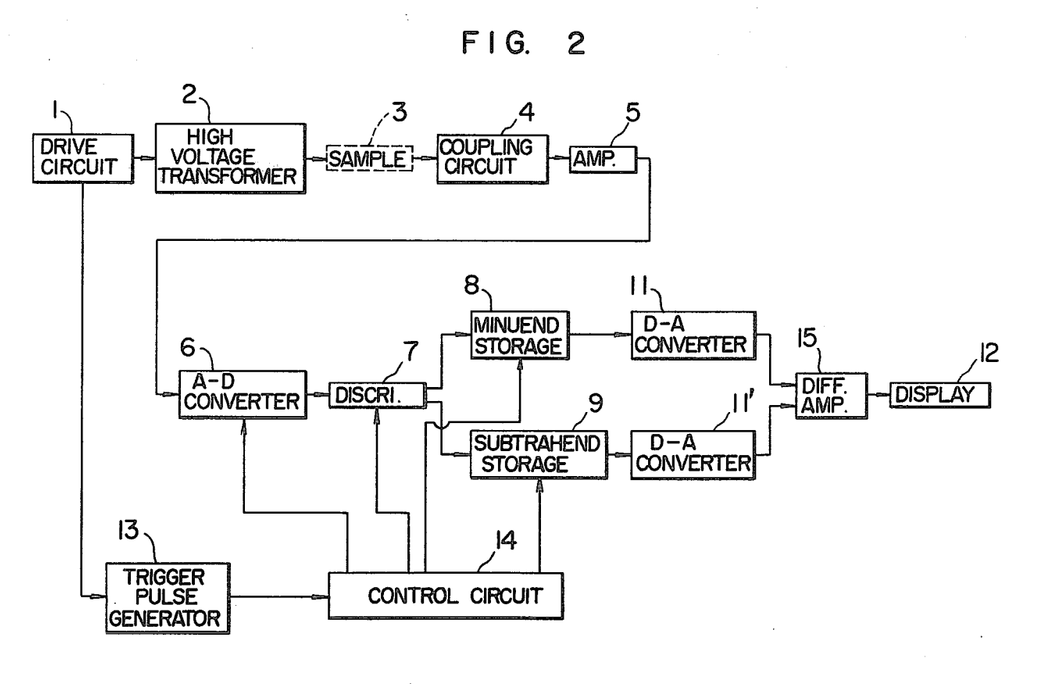
FIG. 2 is a block diagram of another embodiment of the present invention.

FIG. 2 shows another embodiment of the present invention in which like numerals show like parts to those in FIG. 1. The difference between the embodiments of FIG. 2 and FIG. 1 lies in that a pair of D–A converters 11 and 11' are connected to the pair of storage circuits 8 and 9 and a pair of outputs from the D–A converters 11 and 11' are applied to inputs of a differential amplifier 15. The signals are stored in the storage circuits 8 and 9 in the same manner as in the embodiment of FIG. 1 and the contents are D–A converted in phase with the power supply voltage, and the outputs of the D–A converters 11 and 11' are applied to the inputs of the differential amplifier 15. Thus, in the present embodiment, the signals after the D–A conversion are subtracted. The output of the differential amplifier 15 is displayed by the display 12 to detect the corona discharge.

Figure 3:
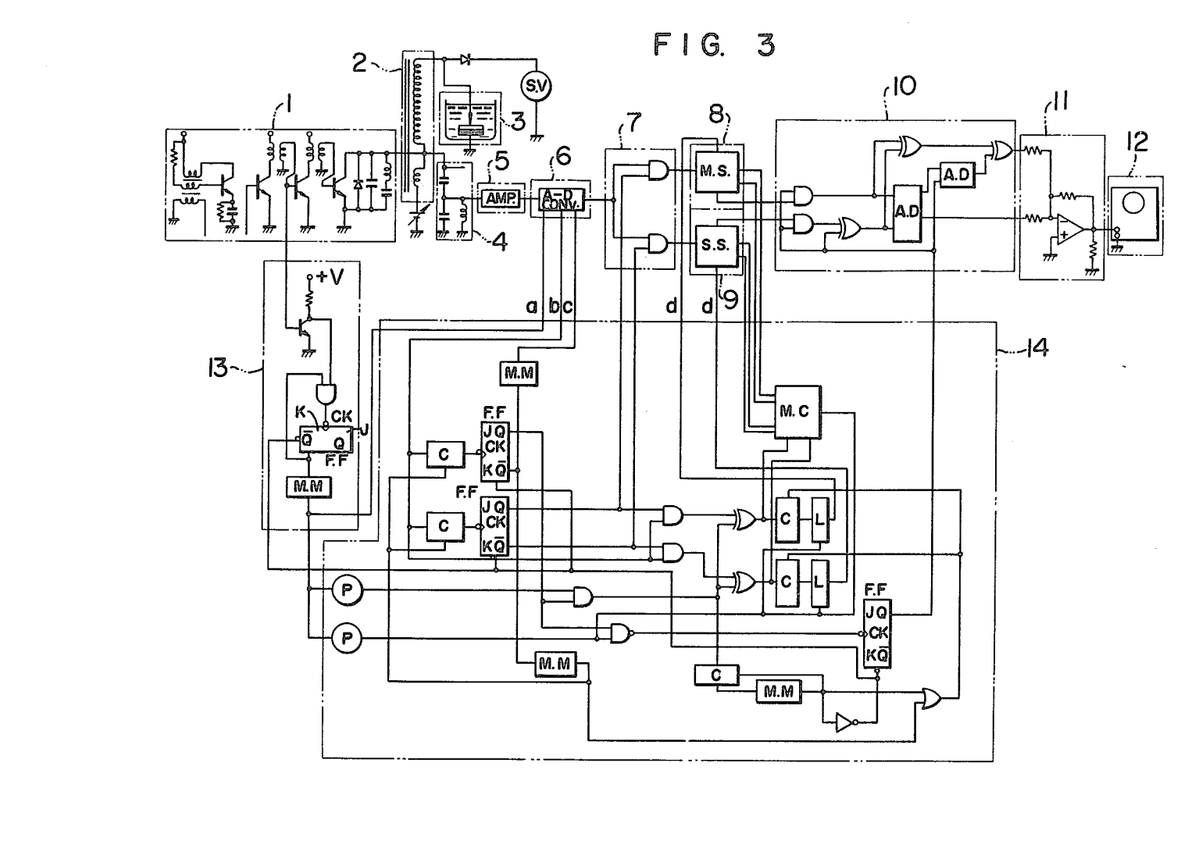
FIG. 3 illustrates a particular circuit diagram of the embodiment shown in FIG. 1.
Figure 4:
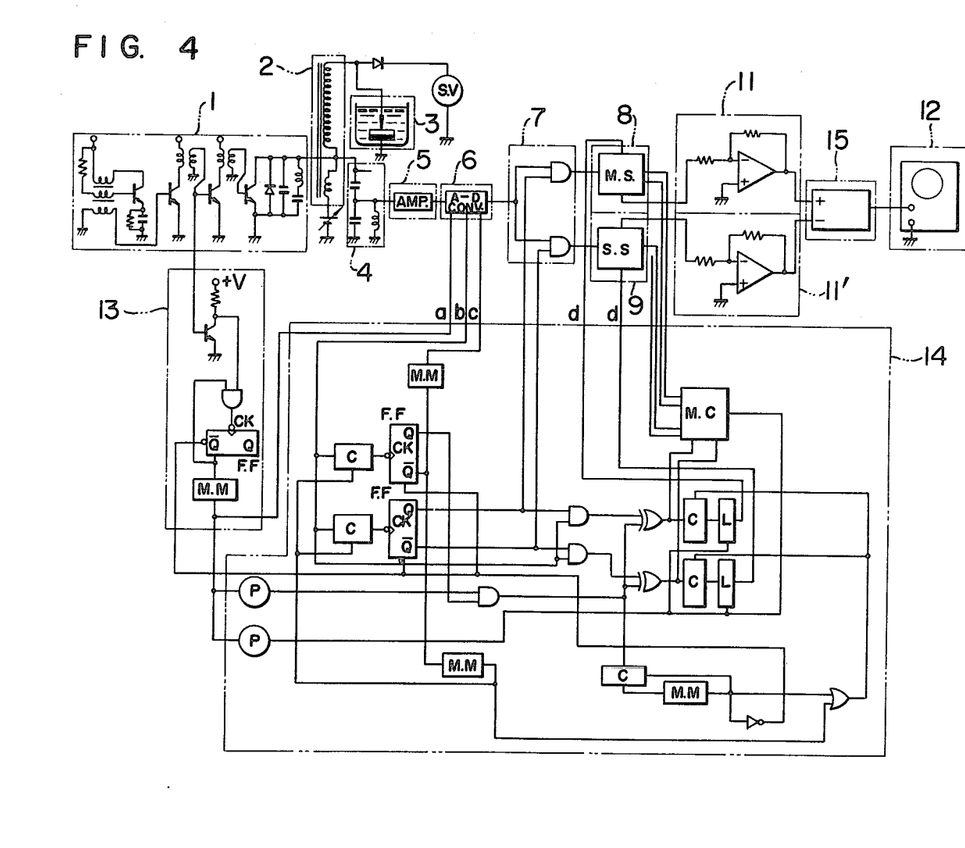
FIG. 4 illustrates a particular circuit diagram of the embodiment shown in FIG. 2.

FIG. 3 shows a specific circuit of the embodiment of FIG. 1 while FIG. 4 shows a specific circuit of the embodiment of FIG. 2. In FIGS. 3 and 4, like numerals represent corresponding elements to those of FIGS. 1 and 2, respectively. In FIGS. 3 and 4, symbol M.M represents a monostable multivibrator, F.F. a flip-flop, C a counter, L a latch, M.C a control circuit for producing read and write signals for the storage circuits, A.D an adder, and P a pulse generator. A symbol a denotes a line for transmitting a start pulse for the A–D conversion, b for a sampling pulse, c a stop pulse for the A–D conversion, and d for an address signal for the storage circuits. Depending on the number of bits of the A–D converted digital signals, the circuits of FIGS. 3 and 4 must be modified slightly because the circuits of FIGS. 3 and 4 show the connection for a single bit of the A–D converted digital signal. For example, when the four-bit digital signal is used, the A–D converter 6 has four output lines and the discriminator 7 comprises eight AND gates, the storage circuits 8 and 9 have for input/output lines, respectively, and the adder/subtractor 10 and the D–A converter 11 are designed for four bits.

Figure 5A:
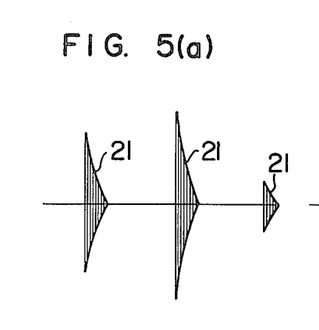
FIGS. 5(a) and 5(b) show waveforms observed by an oscilloscope of corona signals on which periodic noises are superimposed.
Figure 5B:
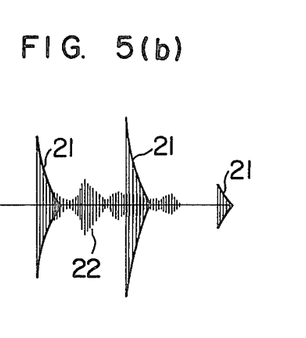

FIG. 5 shows corona signals (output of the amplifier 5) on which periodic noise is superimposed, as displayed on an oscilloscope in the form of analog signal, in which FIG. 5(a) shows the waveform without corona discharge and FIG. 5(b) shows the waveform with corona discharge, where 21 denotes the noise and 22 denotes the corona signal. When displayed on the oscilloscope, the noise 21 appears as a static image because it periodically appears with the same pattern in each cycle but the corona signal does not appear as a static image because it has no definite regularity although it is displayed at the substantially same phase as the noise. Under this condition, the noise 21 is always displayed as shown even if the corona discharged does not occur, and the corona discharge, if it occurs, may be quite undistinguishable depending on the phase of occurrence.

Figure 6A:
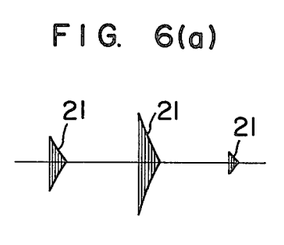
FIGS. 6(a) and 6(b) show waveforms after noise elimination process using analog subtraction.
Figure 6B:
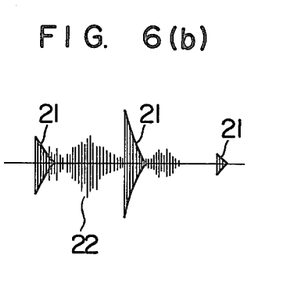

FIG. 6 shows the effect of the noise elimination by analog process in which periodically repeated signal in the output of the amplifier 5 and delayed version of that signal through a delay circuit having a delay time equal to one cycle of the signal are subtracted one from the other, or a signal in the output of the amplifier 5 which is free from the corona signal is produced and applied together with the output of the amplifier 5 to the inputs of a differential amplifier for subtraction. Although the noise 21 is reduced to approximately one half, the corona signal of the phase which prevents the display of the static image still exists because the noise at the input of the delay circuit does not completely coincide with the noise at the output or the production of the corona discharge free signal results in uncontrollable small error in the waveform, which results in a difference between the inputs to the differential amplifier.

Figure 7A:
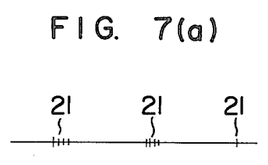
FIGS. 7(a) and 7(b) show waveforms derived from the apparatus of the present invention.
Figure 7B:
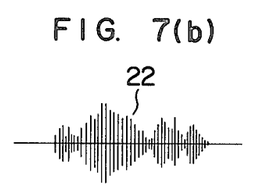

FIG. 7 shows waveforms derived from the corona discharge detection apparatus of the present invention, in which FIG. 7(a) shows the waveform without corona discharge and FIG. 7(b) shows the waveform with corona discharge. As shown, the periodic noise 21 is substantially eliminated while the non-periodic corona signal 22 is not eliminated but displayed. In this manner, by digital converting the detected analog corona signals, subtracting one from the other, analog converting the resulting signal by the D–A converter and repetitively sweeping the output of the D–A converter on the oscilloscope, the corona discharge can be detected without being affected by the noise. Therefore, the precision of the detection is enhanced. This method is particularly effective in detecting the corona discharge the flyback transformer in which much periodic noise is included.

Figure 8:
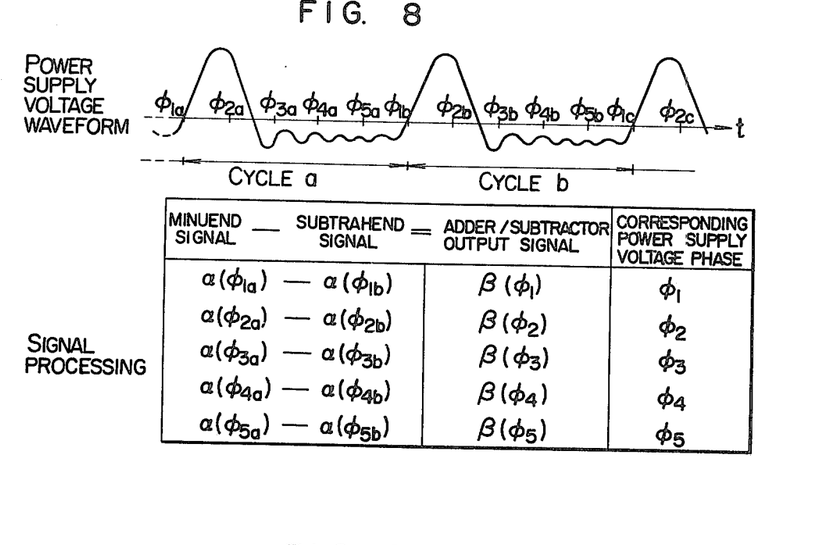
FIG. 8 illustrates a phase relation between a power supply voltage waveform and a signal after the subtraction process to be applied to a display.

FIG. 8 illustrates the manner of signal processing in which digital signals in different cycles of the power supply voltage stored in the storage circuits 8 and 9 are subtracted one from the other in the adder/subtractor 10 in phase synchronism with the power supply voltage and the output of the adder/subtractor 10 is applied to the display 12 through the D-A converter 11. As shown, the digital signals which are in phase with each other in the waveform of the power supply voltage are subtracted one from the other and the differential signal is applied to the display 12 through the D-A converter 11. The differential signal is applied to the display 12 in phase with the waveform of the power supply voltage. In FIG. 8, five phases ($\phi_1$, $\phi_2$, $\phi_3$, $\phi_4$, $\phi_5$) of the power supply voltage waveform are shown, in which a suffix a is added to the phases of the cycle a and a suffix b is added to the phases of the cycle b to indicate the different cycles. Symbol $\alpha$ represents the digital signal at each phase and $\beta$ represents the output signal of the adder/subtractor 10.

On the other hand, a prior art corona discharge detection apparatus includes a calibration pulse generating circuit for calibrating discharge charge. A calibration pulse generated thereby is applied to a corona signal detecting impedance or the coupling circuit through a capacitor so that the magnitudes of the corona signal and the calibration pulse are compared to calibrate the amount of discharge. When the calibration of the amount of discharge is carried out while being monitoring by an oscilloscope, the calibration pulse is synchronized with the cycle of the power supply voltage to display a static image and the magnitudes of the displayed calibration pulse and corona signal are compared to determine the amount of discharge. In this case, it is preferable that the calibration pulses extend over the entire cycle of the power supply voltage so that the brightness of the image on the oscilloscope is increased and flicker of the image is reduced.

Figure 9A:
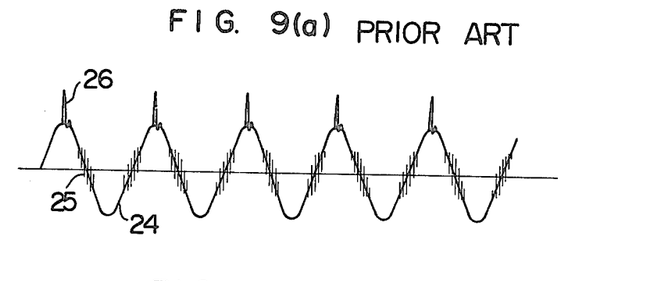
FIGS. 9(a) and 9(b) show waveforms of corona discharge in a prior art apparatus.
Figure 9B:
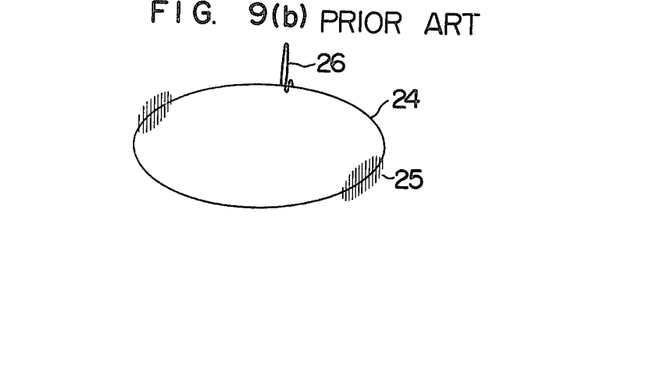

FIG. 9(a) shows a waveform derived in this method as displayed on the CRT of the oscilloscope. In FIG. 9(a), numeral 24 denotes the power supply voltage waveform, 25 the corona signal and 26 the calibration pulse which occurs at a fixed phase of the power supply voltage waveform 24. FIG. 9(b) shows a Lissajou's figure of the corona signal 25 and the calibration pulse 26. In this case, by producing the calibration pulse 26 at a fixed phase to the power supply voltage waveform 24, the calibration pulse is displayed as a static image so that the comparison with the corona signal is facilitated.

On the other hand, when the corona signal on which the noise which is in synchronism with the cycle of the power supply voltage is superimposed is converted to the digital signals to produce first and second digital signals which appear in first cycles, e.g. odd-numbered cycles and second cycles, e.g. even-numbered cycles, respectively, which are in synchronism with the power supply voltage, and the second digital signal is subtracted from the first digital signal to eliminate the noise for enabling the detection of the corona signal, the same calibration pulses are introduced in both the first digital signal and the second digital signal and extend over the entire cycle of the power supply voltage in order to allow the calibration of the amount of discharge. As a result, the calibration pulses are cancelled out by subtraction and hence the calibration cannot be attained.

Figure 10A:
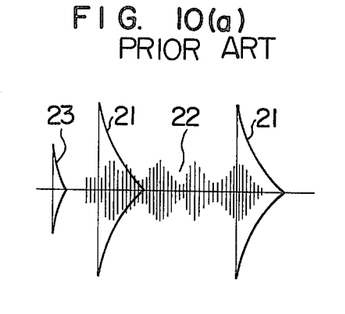
FIGS. 10(a), 10(b) and 10(c) illustrate methods for applying calibration pulses.
Figure 10B:
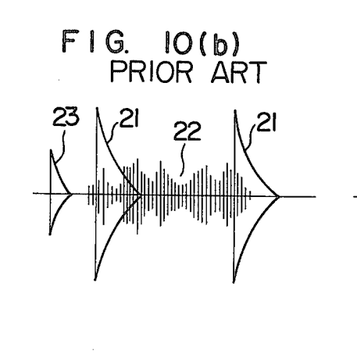
Figures 10C, 11C:
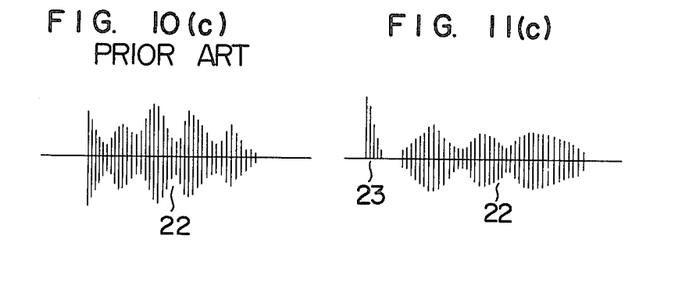
FIGS. 11(a), 11(b) and 11(c) illustrate methods for applying calibration pulses in accordance with the present invention.

FIG. 10 shows the waveform observed in the above circumstance, in which FIG. 10(a) shows the waveform of the first cycle and FIG. 10(b) shows the waveform of the second cycle, and numeral 22 denotes the corona signal, 23 the calibration pulse, and 21 the noise which is in synchronism with the power supply voltage. When the waveform (b) of the second cycle is subtracted from the waveform (a) of the first cycle, the noise is eliminated and at the same time the calibration pulse is also eliminated as shown in FIG. 10(c).

Figure 11A:
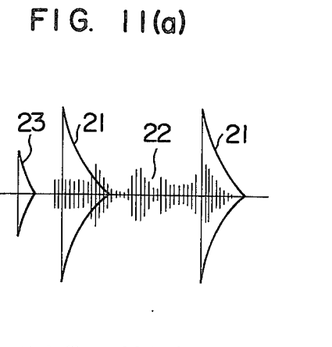
Figure 11B:
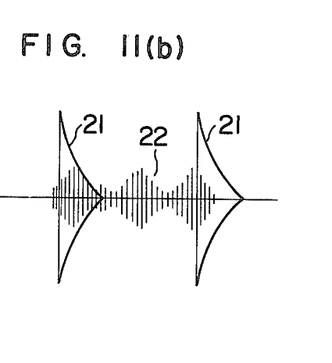

The present invention is directed to overcome the above difficulty. Namely, as shown in FIG. 11, the calibration pulse 23 appears in the first cycle (a) which is in synchronism with the power supply voltage but the calibration pulse 23 does not appear in the second cycle (b). That is, the calibration pulse generating circuit is designed such that the calibration pulse appears only in the digital signal of either cycle. In this manner, only the noise 21 is eliminated while the calibration pulse 23 remains as shown in FIG. 10(c) so that the calibration is attained.

Figure 12:
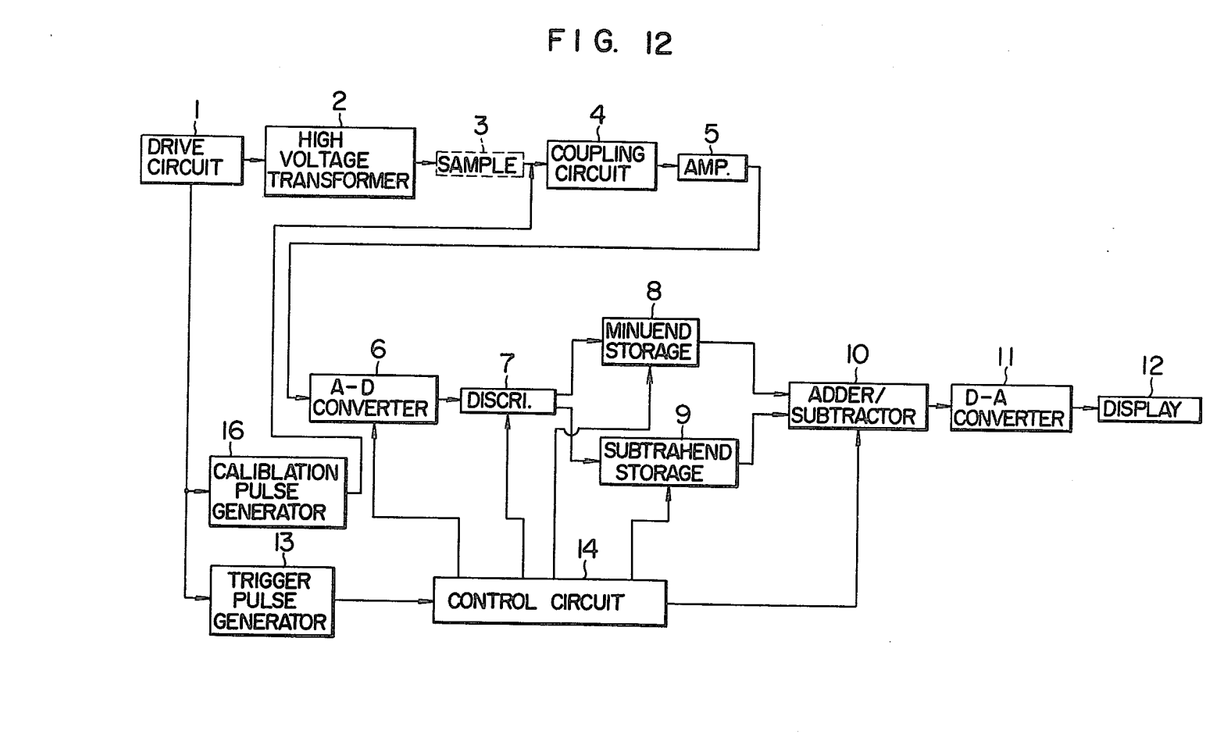
FIG. 12 shows a block diagram of another embodiment of the present invention.

FIG. 12 shows a block diagram of one embodiment of a quantative detection apparatus of the corona discharge according to present invention, in which numeral 1 denotes the drive circuit for driving the high voltage transformer 2, 3 the sample to which a high voltage of the high voltage transformer 2 is applied, 4 the coupling circuit or impedance coupled to the sample 3. The corona signal detected by the coupling circuit 4 is applied to the amplifier 5, the A-D converter 6 and the discriminator 7, and the resulting digital signal in one cycle is stored in the minuend signal storage circuit 8 while the digital signal in the other cycle is stored in the subtrahend signal storage circuit 9. The signals read from the storage circuits 8 and 9 are subtracted one from the other in the adder/subtractor 10 and the resulting signal is applied through the D-A converter 11 to the display 12. Numeral 13 denotes the trigger pulse generating circuit, 14 the control circuit, and 16 the calibration pulse generating circuit. The pulse generated by the calibration pulse generating circuit 16 is applied to the coupling circuit 4 such that the calibration pulse appears only in the digital pulse of one of the cycles.

Figure 13:
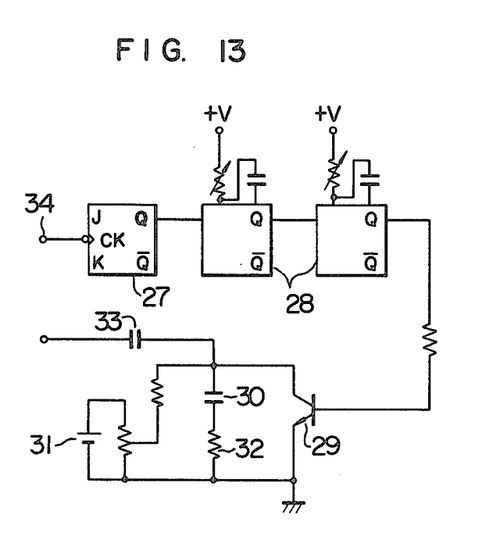
FIG. 13 shows an embodiment of a calibration pulse generating circuit in the embodiment of FIG. 12.

FIG. 13 shows an embodiment of the calibration pulse generating circuit 16. A square wave signal which is in synchronism with the power supply voltage and has a frequency equal to that of the power supply voltage is applied from an input terminal 34 to a flip-flop circuit 27 as a clock pulse, and the flip-flop circuit 27 produces a square wave signal having a frequency equal to one half of that of the clock pulse. This output is applied to an input of a monostable multivibrator 28 which produces a switching pulse of a sufficient duration to discharge the charge stored in a charge-discharge capacitor 30, at a base of a switching transistor 29 which forms a discharge path to the capacitor 30. Thus, the charge-discharge capacitor 30 is charged and discharged at every other cycle of the power supply voltage. Numeral 31 denoted a D.C. power supply for charging the capacitor 30. In this manner, the discharge pulse having a known amount of discharge determined by the capacitor 30 and a resistor 32 is applied to the corona discharge detecting coupling circuit 4 of FIG. 12 through the coupling capacitor 33.

Figure 14:
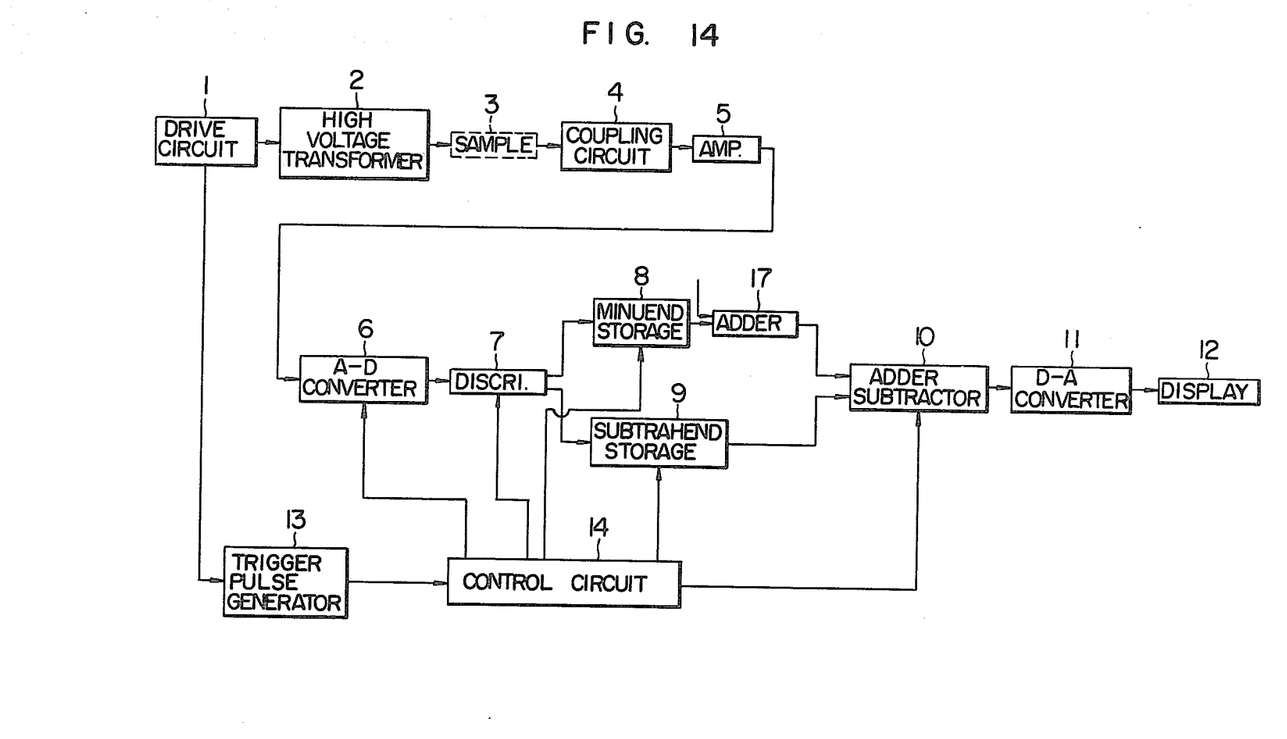
FIG. 14 shows a block diagram of a further embodiment of the present invention.

FIG. 14 shows another embodiment of the present invention, which is substantially similar to the embodiment of FIG. 1 except that the output of the storage circuit 8 is applied to an adder 17 in which a digital signal of a preset calibration pulse is added thereto. The output of the storage circuit 9 is subtracted from the output of the adder 17 by the adder/subtractor 10. In this manner, the periodic noise is eliminated while the calibration pulse remains so that the corona discharge can be observed while calibrating the amount of discharge.

Figure 15:
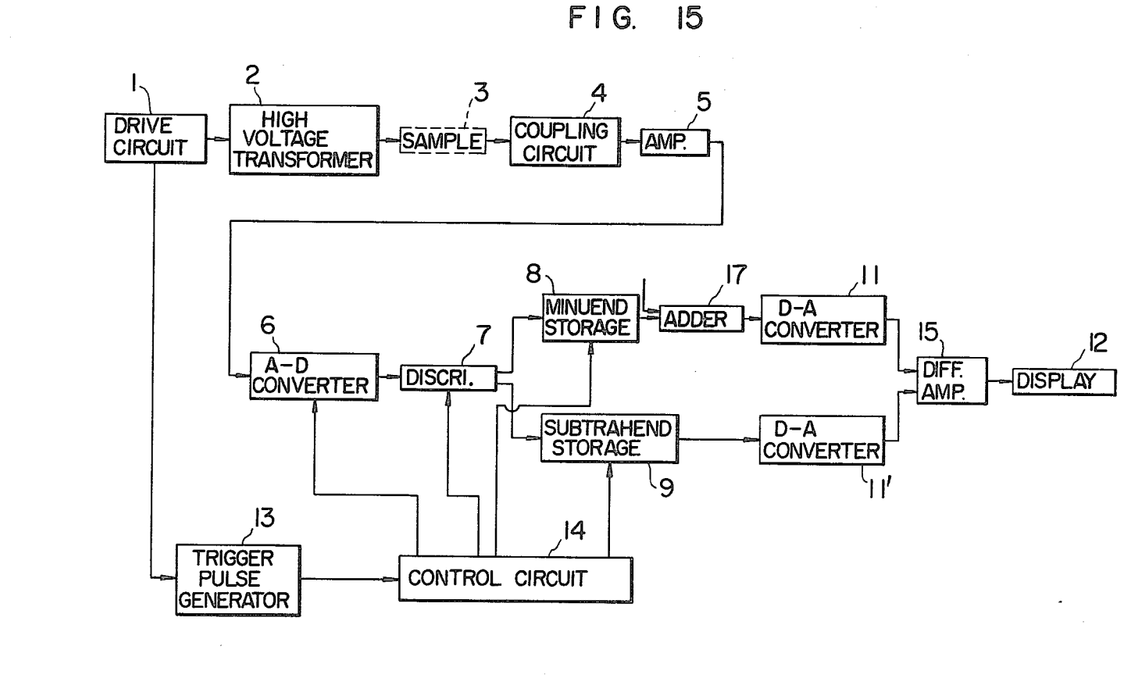
FIG. 15 shows a block diagram of a still further embodiment of the present invention.

FIG. 15 shows a further embodiment of the present invention which is substantially similar to the embodiment of FIG. 2 except that the adder 17 is provided between the first storage circuit 8 and the first D-A converter 11 for adding together the output of the first storage circuit 8 and a digital signal of a preset calibration pulse. The present embodiment enables the calibration of the amount of discharge which cannot be attained in the embodiment of FIG. 2.

The feature of the present invention is the ability for completely separating the corona signal from the periodic noise having substantially same frequency spectrum. Even if the noise strength is larger than the signal strength, the periodicity and non-periodicity of the noise and signal are utilized such that the repeatedly produced analog signal is A-D converted and stored in the form of digital signal with the noise being stored in the form of periodic digital signal, the corona signal being stored in the form of non-periodic digital signal and the signal including the noise being stored in the form of corresponding digital signal, and those signals of different cycles are subtracted one from the other in phase synchronism with the original analog signal (i.e. in phase with the power supply voltage) to cancel the noise and extract only the corona signal. The operation of storing the signals which arrive sequentially in time in the storage circuits and subtracting the stored signals in different cycles one from the other corresponds to the subtraction operation between a signal and a delayed version of that signal through a delay circuit having a delay time of one to several cycles. A problem of waveform distortion which was unavoidable in an analog delay circuit has been resolved by the use of digital storage irrespective of the delay time and complete elimination of noise is accomplished. Although the digital delay has a limit determined by the storage capacity of the storage circuit and the interval of sampling, the delay can be set to any desired value within the limit. When the noise is eliminated in the form of analog signal without using the delay circuit, it is difficult to carry out the subtraction between the identical noise because the electrical signals are transmitted through different channels and hence complete elimination of noise is not attained. In the present invention, since the common analog signal (i.e. the corona signal including the periodic noise) is digitally processed, the noise in the respective cycles are completely identical.

According to the present invention, in displaying the corona signal including the periodic noise having the substantially same frequency spectrum as that of the corona signal, the noise is completely eliminated to facilitate the display of the corona signal and the measurement of the corona signal of a phase which heretofore made the display difficult because of noise. Accordingly, the present invention enables the design of insulation having higher reliability.

Furthermore, according to the present invention, the corona signal including the noise which is in synchronism with the power supply voltage is converted to the digital form to produce the first and second digital signals which appear in the first and second cycles, respectively, which are in synchronism with the power supply voltage, and the second digital signal is subtracted from the first digital signal to eliminate the noise for enabling quantative measurement of the amount of discharge in detecting the corona discharge. For example, when the present invention is applied to the quantative measurement of the corona discharge of the flyback transformer which generates high order harmonics of the power supply voltage in synchronism with the power supply voltage, the noise due to the high order harmonics can be eliminated and the quantative measurement of the corona discharge is facilitated.

What is claimed is:

1. A corona discharge detection apparatus comprising:
   an A-D converter for converting a corona signal including a noise component which is in synchronism with a frequency of a power supply voltage into a predetermined number of digital signals for each cycle of said power supply voltage;
   a first storage device coupled to said A-D converter for successively storing said predetermined number of digital signals for one cycle of said power supply voltage;
   a second storage device coupled to said A-D converter for successively storing said predetermined number of digital signals for a different cycle of said power supply voltage;
   an arithmetic operation device coupled to said first and second storage devices for successively subtracting in the order of storage each of the predetermined number of digital signals stored in said first storage device from a corresponding one of the predetermined number of digital signals stored in said second storage device to produce a signal indicative of a detected corona discharge which is substantially free from periodic noise synchronized with the frequency of said power supply voltage;
   means for providing a trigger signal synchronized with a predetermined phase of said power supply voltage; and,
   a control means responsive to said trigger signal for providing timed output control signals for controlling the synchronized operation of said A-D converter, first and second storage devices and arithmetic operation device to produce the successive storage and subtraction of the digital signals from the different cycles of the power supply voltage.

2. A corona discharge apparatus as in claim 1 further comprising
   means for generating a digital calibration pulse and causing a signal corresponding to said calibration pulse to be contained in one of the two digital signal streams emanating from said first and second storage devices.

3. A corona discharge detection apparatus according to claim 2 wherein said means for generating a calibration pulse comprises a flip-flop for producing a clock pulse which is in sychronism with the frequency of the power supply voltage, a monostable multivibrator for receiving the output of said flip-flop, a switching device adapted to be switched by the output of said monostable multivibrator, a capacitor adapted to be charged during the off period of said switching device and discharged during the on period thereof, said monostable multivibrator controlling said switching device to cause said capacitor to be charged and discharged at every other cycle of the power supply voltage, and a coupling capacitor for transmitting the signal formed by the discharge of said capacitor to the input signal path of said A-D converter, whereby a calibration pulse appears only in the digital signal of one of said first and second storage devices to allow the calibration of the amount of discharge.

4. A corona discharge detection apparatus comprising:

an A-D converter for converting a corona signal including a noise component which is in synchronism with a frequency of a power supply voltage into a predetermined number of digital signals for each cycle of said power supply voltage;

a first storage device coupled to said A-D converter for successively storing said predetermined number of digital signals for one cycle of said power supply voltage;

a second storage device coupled to said A-D converter for successively storing said predetermined number of digital signals for a different cycle of said power supply voltage;

an arithmetic operation device coupled to said first and second storage devices for successively subtracting in the order of storage each of the predetermined number of digital signals stored in said first storage device from a corresponding one of the predetermined number of digital signals stored in said second storage device to produce a signal indicative of a detected corona discharge which is substantially free from periodic noise synchronized with the frequency of said power supply voltage;

a D-A converter for converting the output of said arithmetic operation device into an analog signal;

a display device for displaying the output of said D-A converter;

means for providing a trigger signal synchronized with a predetermined phase of said power supply voltage; and, a control means responsive to said trigger signal for providing timed output signals for controlling the synchronized operation of said A-D converter, first and second storage devices and arithmetic operation device to produce the successive storage and subtraction of the digital signals from the different cycles of the power supply voltage.

5. A corona discharge detection apparatus as in claim 4 wherein said control means causes said A-D converter, first and second storage devices, and arithmetic operation device to repeatedly operate in synchronism to thereby provide an output signal at said D-A converter indicative of the occurrence of a corona discharge.

6. A corona discharge apparatus as in claim 5 further comprising means for generating a digital calibration pulse and causing a signal corresponding to said calibration pulse to be contained in one of the two digital signal streams emanating from said first and second storage devices.

7. A corona discharge detection apparatus according to claim 6 further including an adder for adding together the output of said first storage circuit and said calibration pulse, whereby the output of said second storage circuit is subtracted from the output of said adder to calibrate the amount of discharge.

8. A corona discharge detection apparatus comprising:

an A-D converter for converting a corona signal including a noise component which is in synchronism with a frequency of a power supply voltage into a predetermined number of digital signals for each cycle of said power supply voltage;

a first storage device coupled to said A-D converter for successively storing said predetermined number of digital signals for one cycle of said power supply voltage;

a second storage device coupled to said A-D converter for successively storing said predetermined number of digital signals for a different cycle of said power supply voltage;

first and second D-A converters connected to said first and second storage devices respectively for successively converting each of the digital signals stored in said first and second storage devices in accordance with the order of storage of said digital signals, a digital signal of said first storage device being converted simultaneously with a corresponding digital signal of said second storage device;

a differential amplifier for receiving and subtracting the outputs of said first and second D-A converters to form a signal indicative of a detected corona discharge which is substantially free of periodic noise synchronized with the frequency of said power supply voltage;

a display device for displaying the output of said differential amplifier;

means for providing a trigger signal synchronized with a predetermined phase of said power supply voltage; and, a control circuit responsive to said trigger signal for providing timed output signals for controlling the synchronized operation of said A-D converter and first and second storage devices to produce the successive storage and subtraction of the digital signals from the different cycles of the power supply voltage.

9. A corona discharge detection apparatus as in claim 8 wherein said a control means causes said A-D converter, and first and second storage devices to repeatedly operate in synchronism to thereby provide an output signal from said differential amplifier indicative of the occurrence of a corona discharge.

10. A corona discharge apparatus as in claim 9 further comprising means for generating a digital calibration pulse and causing a signal corresponding to said calibration pulse to be contained in one of the two digital signal streams emanating from said first and second storage devices.

11. A corona discharge detection apparatus according to claim 10 further including an adder for adding together the output of said first storage circuit and said calibration pulse, whereby the output of said adder and the output of said second storage circuit are applied to said first and second D-A converters and the outputs of said first and second D-A converters are applied to said differential amplifier to calibrate the amount of discharge.

* * * * *